United States Patent
Zhang et al.

(10) Patent No.: US 7,611,977 B2
(45) Date of Patent: Nov. 3, 2009

(54) PROCESS OF PHOSPHORUS DIFFUSION FOR MANUFACTURING SOLAR CELL

(75) Inventors: Lingjun Zhang, Suzhou (CN); Yunxiang Zuo, Suzhou (CN)

(73) Assignee: CSI Cells Co. Ltd., Suzhou, Jiangsu Province (CN)

( * ) Notice: Subject to any disclaimer, the term of this patent is extended or adjusted under 35 U.S.C. 154(b) by 0 days.

(21) Appl. No.: 12/286,942

(22) Filed: Oct. 3, 2008

(65) Prior Publication Data

US 2009/0093081 A1  Apr. 9, 2009

(30) Foreign Application Priority Data

Oct. 8, 2007  (CN) .................. 2007 1 0132841

(51) Int. Cl.
*H01L 21/22* (2006.01)
(52) U.S. Cl. .................. 438/558; 438/542; 438/563; 438/795; 257/E21.14; 257/E21.142
(58) Field of Classification Search .......... 438/765, 438/799; 257/E21.14, E21.142, E21.145, 257/E21.152, E21.302
See application file for complete search history.

(56) References Cited

U.S. PATENT DOCUMENTS 6,344,608 B2 * 2/2002 Kariya et al. .......... 136/257

* cited by examiner

*Primary Examiner*—Savitri Mulpuri
*Assistant Examiner*—Cheung Lee
(74) *Attorney, Agent, or Firm*—Fulwider Patton LLP

(57) ABSTRACT

This invention discloses a process of phosphorus diffusion for manufacturing solar cell, comprising annealing a mono-crystalline silicon wafer in a nitrogen atmosphere at 900-950° C. for twenty to thirty minutes, carrying oxidation treatment in a hydrogen chloride atmosphere at 850-1050° C. to form a 10 to 30 nm thick oxide layer on the surface of said silicon wafer, diffusing from a phosphorus source at 850-900° C., until a block resistance of a material surface is controlled at 40 to 50 ohms, and the junction depth is at 0.2 to 1.0 microns, and annealing in a nitrogen atmosphere at 700-750° C. for thirty to sixty minutes to complete the phosphorus diffusion of said mono-crystalline silicon wafer. This invention allows the use of 4 N~5 N mono-crystalline silicon as the material for manufacturing solar cells, so, the low purity material such as metallurgical silicon can be used, which greatly reduces the cost of materials.

3 Claims, No Drawings

PROCESS OF PHOSPHORUS DIFFUSION FOR MANUFACTURING SOLAR CELL

CROSS-REFERENCES TO RELATED APPLICATIONS

This application claims priority from Chinese Patent Application No. 200710132841.8, filed Oct. 8, 2007.

BACKGROUND

This invention relates to a process for manufacturing solar cells by diffusion, and more particularly to a process of phosphorus diffusion for manufacturing solar cell.

Solar energy is an inexhaustible and renewable energy source for mankind, and also a clean energy, so utilization of solar energy can effectively reduce environmental pollution. The use of photoelectric effect of solar energy is a field that is the subject of much research, and one of the fastest growing and most dynamic research fields in recent years. Solar cells are manufactured mainly based on semiconductor materials, and its working principle is that the photoelectric materials absorb solar energy and produce electrical currents through photoelectric conversion. Silicon solar cells are commonly used today, and are classified into mono-crystalline silicon cells, amorphous silicon solar cells, poly-silicon solar cells and so on. Among them, mono-crystalline silicon solar cells have the highest conversion efficiency and its technology is the most mature.

In previous art, methods for manufacturing mono-crystalline silicon solar cells includes the following steps: (i) peeling off the affected layer; (ii) etching; (iii) diffusion and junction making; (iv) plasma etching of edge; (v) removing phosphorus glass; (vi) apply anti-reflection coating; (vii) screen printing; and (viii) sintering. The diffusion and junction making (usually phosphorus diffusion and junction making) is a key step, and the quality of this step will affect the photoelectric conversion efficiency. In a commercial process, the typical steps of junction making are: first, pass nitrogen through liquid POCl3, transfer the impurity for doping onto the surface of a high-temperature semiconductor by using carrier gas, where the depth of diffusion of impurities is about hundreds of nanometer; then, treat with high temperature so that the impurity atoms pre-deposited on the surface continue to diffuse into deep base and thus form a N+/N layer, where such a structure is conducive to making the electrode in subsequent steps. Such emission zone structure can also be obtained with a one step diffusion method, but it needs to add a corrosion process; a fast heating process can also be used for said junction making, which can greatly simplify the process, but this process is only at an early stage.

However, the above diffusion and junction making process is based on the use of high quality mono-crystalline silicon, which is usually required to have purity of more than 6 N. But the more the purity, the more expensive the material cost, which makes the price of mono-crystalline silicon solar cells high and is hard to put into universal application. At the same time, by using raw materials of metallic silicon with low purity as a starting material, after melting and refining, uni-directional solidification refining, and so on, the purity can reach 4 N~5 N, but to further purify the material to get more than 6 N high-purity silicon, it would greatly increase the cost, and also reduce the utilization of silicon. Therefore, the development of a phosphorus diffusion method to directly use 4 N~5 N low-purity silicon material to make solar cells with better conversion efficiency will have great significance.

SUMMARY OF THE INVENTION

The object of the present invention is to provide a process of phosphorus diffusion for manufacturing solar cells that allows the use of a lower purity material. This object is achieved according to the technical solution described below, namely a process of phosphorus diffusion for manufacturing solar cell, comprising:

(1) annealing a mono-crystalline silicon wafer in a nitrogen atmosphere at 900-950° C. for 20 to 30 minutes;

(2) carrying oxidation treatment in a hydrogen chloride atmosphere at 850-1050° C. to form a 10 to 30 nm thick oxide layer on the surface of said silicon wafer;

(3) diffusing from a phosphorus source at 850-900° C., until a block resistance of a material surface is controlled at 40 to 50 ohms, and the junction depth is at 0.2 to 1.0 microns; and (4) annealing in a nitrogen atmosphere at 700-750° C. for 30 to 60 minutes to complete the phosphorus diffusion of said mono-crystalline silicon wafer.

In above technical solution, the duration of said oxidation treatment in step (2) is preferably 20 to 30 minutes. The duration for said diffusion from a phosphorus source in step (3) is preferably 25 to 60 minutes.

In the mono-crystalline silicon wafer, heavy metals or micro-defects will move or re-agglutinate at a certain temperature because of the interaction between impurities and impurities, as well as between defects and impurities. Thus, through the annealing process, the impurities in the wafer will become nanometer-sized regions and thereby reduces the density defect recombination centers to raise minority carrier lifetime. However, in conventional technologies, the annealing process would usually take 4 to 5 hours, and the temperature should change from low to high and then to low. However, when used with the mono-crystalline silicon having a 4 N~5 N purity, it is difficult to achieve satisfactory results of removing impurities and getting a good junction effect. In the process of the present invention, the oxidation treatment in a hydrogen chloride atmosphere is added between the steps of annealing and phosphorus diffusion, that is, using the chlorine oxidization method to make an oxide layer. Thus, in the entire process, the temperature changes from high to low then to high and then to low, which is a gradual changing course. The actual tests show that using this method can obtain good results.

With using of the above technical solution, this invention has several advantages compared with the background technologies. In this invention, there are two steps of annealing both before and after the process of phosphorus diffusion to make the impurities in the wafer become nanometer-sized regions and thereby reduce the density defect recombination centers to raise minority carrier lifetime. And the oxidation treatment in a hydrogen chloride atmosphere is added between the steps of annealing and phosphorus diffusion. After said treatment, this invention can use 4 N~5 N low-purity mono-crystalline silicon as the material for manufacturing solar cells, which has greatly reduced the cost of materials and is conducive to putting the mono-crystalline silicon solar cells into universal application.

DETAILED DESCRIPTION OF THE PREFERRED EMBODIMENTS

This invention will be best understood with reference to the following description of example embodiments:

EXAMPLE 1

The following phosphorus diffusion process was conducted with a set of silicon wafers with 5 N purity. In the first step, the silicon wafer were placed in a nitrogen atmosphere for annealing at 950° C. for 20 minutes. Then, the silicon wafer was exposed to a hydrogen chloride atmosphere for an oxidation treatment at 850° C. for 20 minutes. Next, a phosphorus diffusion process was conducted on the silicon wafer at 900° C. for 50 minutes. Finally, the silicon wafer was placed in a nitrogen atmosphere at 750° C. for 30 minutes. Then conventional methods were used for further processing, and solar cells are produced.

In ten randomly selected solar cells made from the process above, the short circuit current Isc is measured, as well as open circuit voltage Voc, the maximum power Pmax, fill factor FF and photoelectric conversion efficiency EF under a condition of AM1.5 and 27° C. temperature. The results are as shown in the table below:

| No. | Isc (A) | Voc (mV) | Pmax (W) | FF (%) | EF (%) |
|---|---|---|---|---|---|
| 1 | 4.46644 | 610.52 | 1.73559 | 63.648 | 11.68116 |
| 2 | 4.54678 | 613.26 | 2.17556 | 77.882 | 14.61594 |
| 3 | 4.53085 | 613.22 | 2.09676 | 78.303 | 14.64234 |
| 4 | 4.49747 | 610.76 | 1.85691 | 76.332 | 14.11197 |
| 5 | 4.38281 | 607.12 | 2.07611 | 69.785 | 12.49769 |
| 6 | 4.44712 | 609.22 | 2.05781 | 76.629 | 13.97298 |
| 7 | 4.42516 | 608.7 | 2.09916 | 76.396 | 13.84986 |
| 8 | 4.43123 | 608.15 | 2.09444 | 77.895 | 14.12916 |
| 9 | 4.46954 | 608.6 | 2.09446 | 76.994 | 14.09635 |
| 10 | 4.50129 | 612.25 | 2.10562 | 76.404 | 14.17161 |
| Average | 4.469869 | 610.18 | 2.039242 | 75.0268 | 13.77691 |

EXAMPLE 2

The following phosphorus diffusion process was conducted with another set of silicon wafers with 5 N purity. In the first step, the silicon wafer was exposed to a nitrogen atmosphere for annealing at 950° C. for 25 minutes. Then, the silicon wafer was placed in a hydrogen chloride atmosphere for an oxidation treatment at 1000° C. for 25 minutes. Next, a phosphorus diffusion process was conducted on the silicon wafer at 900° C. for 30 minutes. Finally, the silicon wafer was placed in a nitrogen atmosphere at 700° C. for 50 minutes. Conventional methods were used for further processing, and solar cells were produced.

Ten of the solar cells were randomly selected, and the short circuit current Isc, open circuit voltage Voc, the maximum power Pmax, fill factor FF and photoelectric conversion efficiency EF were measured under a condition of AM1.5 and 27° C. temperature. The results are as shown in the table below:

| No. | Isc (A) | Voc (mV) | Pmax (W) | FF (%) | EF (%) |
|---|---|---|---|---|---|
| 1 | 4.35766 | 609.14 | 2.04992 | 77.226 | 13.79673 |
| 2 | 4.4196 | 610.17 | 2.09707 | 77.773 | 14.11409 |
| 3 | 4.39372 | 607.99 | 2.07775 | 77.78 | 13.98408 |
| 4 | 4.3689 | 608.53 | 2.06782 | 77.778 | 13.91723 |
| 5 | 4.37946 | 608.45 | 2.05224 | 77.017 | 13.81236 |
| 6 | 4.44184 | 612.49 | 2.13835 | 78.599 | 14.39191 |
| 7 | 4.40191 | 608.81 | 1.71494 | 63.991 | 11.54202 |
| 8 | 4.45567 | 612.57 | 2.10022 | 76.947 | 14.13526 |
| 9 | 4.42383 | 613.46 | 2.10247 | 77.472 | 14.15045 |
| 10 | 4.27499 | 605.99 | 1.78353 | 68.847 | 12.00382 |
| Average | 4.391758 | 609.76 | 2.044531 | 75.343 | 13.5848 |

EXAMPLE 3

The following phosphorus diffusion process was conducted with another set of silicon wafers with 5 N purity. In the first step, the silicon wafer was placed in a nitrogen atmosphere for annealing at 920° C. for 30 minutes. Then, the silicon wafer was placed in a hydrogen chloride atmosphere for an oxidation treatment at 950° C. for 30 minutes. Next, a phosphorus diffusion process was conducted on the silicon wafer at 850° C. for 60 minutes. Finally, the silicon wafer was exposed to a nitrogen atmosphere at 700° C. for 40 minutes. Then conventional methods were used for further processing, and solar cells were produced.

Sixteen of these solar cells were randomly selected, and the short circuit current Isc, open circuit voltage Voc, the maximum power Pmax, fill factor FF and photoelectric conversion efficiency EF were measured under a condition of AM1.5 and 28° C. temperature. The results are as shown in the table below:

| No. | Isc (A) | Voc (mV) | Pmax (W) | FF (%) | EF (%) |
|---|---|---|---|---|---|
| 1 | 4.40454 | 607.89 | 2.00977 | 75.063 | 13.52651 |
| 2 | 4.43724 | 609.05 | 2.04521 | 75.678 | 13.76501 |
| 3 | 4.42288 | 609.12 | 2.09828 | 77.885 | 14.12223 |
| 4 | 4.4701 | 609.89 | 2.08441 | 76.456 | 14.0289 |
| 5 | 4.46758 | 609.76 | 2.08204 | 76.428 | 14.0129 |
| 6 | 4.51984 | 611.04 | 2.10364 | 76.169 | 14.15827 |
| 7 | 4.43159 | 606.86 | 2.07638 | 77.207 | 13.97485 |
| 8 | 4.54037 | 609.98 | 2.12963 | 76.895 | 14.3332 |
| 9 | 4.49947 | 608.79 | 2.0755 | 75.769 | 13.96892 |
| 10 | 4.52432 | 610.23 | 2.11063 | 76.449 | 14.20537 |
| 11 | 4.4557 | 609.58 | 2.02947 | 74.719 | 13.65908 |
| 12 | 4.50928 | 607.72 | 2.01459 | 73.515 | 13.55895 |
| 13 | 4.55504 | 610.54 | 2.14621 | 77.173 | 14.44481 |
| 14 | 4.51071 | 610.46 | 2.08132 | 75.585 | 14.00807 |
| 15 | 4.51885 | 611.89 | 2.0619 | 74.571 | 13.87738 |
| 16 | 4.49353 | 609.17 | 2.07788 | 75.909 | 13.98492 |
| Average | 4.485065 | 609.4981 | 2.076679 | 75.96694 | 13.97684 |

COMPARISON EXAMPLE 1

Using traditional phosphorus diffusion process to produce a set of solar cells with 5 N purity silicon wafer, twelve solar cells were randomly selected, and the short circuit current Isc, open circuit voltage Voc, the maximum power Pmax, fill factor FF and photoelectric conversion efficiency EF were measured under a condition of AM1.5 and 27° C. temperature. The results are as shown in the table below:

| No. | Isc (A) | Voc (mV) | Pmax (W) | FF (%) | EF (%) |
|---|---|---|---|---|---|
| 1 | 3.92058 | 0.60462 | 0.84076 | 0.35468 | 5.65863 |
| 2 | 3.98012 | 0.61667 | 0.92812 | 0.37815 | 6.24662 |
| 3 | 3.97738 | 0.61748 | 0.97356 | 0.39641 | 6.55244 |
| 4 | 4.04155 | 0.61912 | 1.05359 | 0.42107 | 7.09106 |
| 5 | 4.23414 | 0.61565 | 1.13905 | 0.43696 | 7.66626 |
| 6 | 4.24061 | 0.62082 | 1.20179 | 0.45649 | 8.08848 |
| 7 | 4.38697 | 0.61601 | 1.31707 | 0.48737 | 8.86438 |
| 8 | 4.57012 | 0.61332 | 1.41021 | 0.50312 | 9.49122 |
| 9 | 4.62997 | 0.61498 | 1.49039 | 0.52343 | 10.03087 |
| 10 | 4.64822 | 0.61207 | 1.63927 | 0.57619 | 11.03289 |
| 11 | 4.59806 | 0.61483 | 1.79448 | 0.63476 | 12.07754 |
| 12 | 4.70738 | 0.6133 | 1.93556 | 0.67043 | 13.02708 |
| Average | 4.327925 | 0.614906 | 1.310321 | 0.486588 | 8.818956 |

From the above examples it can be seen that the solar cells produced from the three examples of the present invention have more consistent performance, and the average conversion efficiency of these three batches of solar cells are respectively 13.77691%, 13.5848% and 13.97684%, while the performance of the solar cells produced in the comparison batch using prior art technology fluctuate greatly, and its average conversion efficiency is only 8.818956%. Because of the bad consistency and low conversion efficiency of solar cells produce by means as in the comparing example, it cannot be used in the commercial applications.

Thus, the application of the present process in this invention can effectively utilize the mono-crystalline silicon wafers with lower purity to manufacture solar cells and thereby greatly reduce the manufacturing cost of solar cells.

We claim:

1. A process of phosphorus diffusion for manufacturing solar cells, comprising:
    annealing a mono-crystalline silicon wafer in a nitrogen atmosphere at 900-950° C. for twenty to thirty minutes;
    carrying oxidation treatment in a hydrogen chloride atmosphere at 850-1050° C. to form a 10 to 30 nm thick oxide layer on the surface of said silicon wafer;
    diffusing from a phosphorus source at 850-900° C., until a block resistance of a material surface is controlled at 40 to 50 ohms, and the junction depth is at 0.2 to 1.0 microns; and
    annealing in a nitrogen atmosphere at 700-750° C. for thirty to sixty minutes to complete the phosphorus diffusion of said mono-crystalline silicon wafer.

2. The process of claim 1, wherein a duration of said oxidation treatment is in the range of twenty to thirty minutes.

3. The process of claim 1, wherein a duration of said diffusion process is twenty-five to sixty minutes.

* * * * *